United States Patent [19]

Alferness et al.

[11] Patent Number: 4,728,168
[45] Date of Patent: Mar. 1, 1988

[54] COMPOSITE CAVITY LASER UTILIZING AN INTRA-CAVITY ELECTROOPTIC WAVEGUIDE DEVICE

[75] Inventors: Rodney C. Alferness, Holmdel; Gadi Eisenstein, Middletown; Steven K. Korotky, Toms River, all of N.J.

[73] Assignee: American Telephone and Telegraph Company, AT&T Bell Laboratories, Murray Hill, N.J.

[21] Appl. No.: 935,028

[22] Filed: Nov. 26, 1986

Related U.S. Application Data

[62] Division of Ser. No. 572,634, Jan. 20, 1984, Pat. No. 4,667,331.

[51] Int. Cl.$^4$ ................................................. H01S 3/10
[52] U.S. Cl. ..................... 350/96.14; 372/6; 372/12; 372/18; 372/20; 372/26; 372/94; 372/98
[58] Field of Search ............... 350/96.13, 96.14, 96.15; 372/6, 12, 92, 94, 98, 101, 108, 18, 20, 26

[56] References Cited

U.S. PATENT DOCUMENTS

| | | | |
|---|---|---|---|
| 3,405,370 | 10/1968 | Kaminow | 372/98 X |
| 3,763,443 | 10/1973 | Kinsel et al. | 372/12 |
| 3,783,403 | 1/1974 | Hook et al. | 372/12 |
| 3,877,781 | 4/1975 | Kaminow | 350/96.14 |
| 4,002,997 | 1/1977 | Thompson | 350/96.14 X |
| 4,005,927 | 2/1977 | Caton | 350/96.14 |
| 4,012,113 | 3/1977 | Kogelnik et al. | 350/96.13 |
| 4,013,365 | 3/1977 | Vali et al. | 372/94 X |
| 4,039,249 | 8/1977 | Kaminow et al. | 350/96.13 X |
| 4,111,523 | 9/1978 | Kaminow et al. | 350/96.14 |
| 4,114,257 | 9/1978 | Bellavance | 350/96.14 X |
| 4,146,297 | 3/1979 | Alferness et al. | 350/96.14 |
| 4,157,860 | 6/1979 | Marcatili | 350/96.14 |
| 4,243,295 | 1/1981 | Alferness | 350/96.14 |
| 4,251,130 | 2/1981 | Marcatili | 350/96.14 |
| 4,273,411 | 6/1981 | Alferness | 350/96.14 |
| 4,372,643 | 2/1983 | Liu et al. | 350/96.14 |
| 4,380,364 | 4/1983 | Marcatili | 350/96.14 |
| 4,381,139 | 4/1983 | Alferness | 350/96.14 |
| 4,384,760 | 5/1983 | Alferness | 350/96.14 |
| 4,390,236 | 6/1983 | Alferness | 350/96.14 |
| 4,400,052 | 8/1983 | Alferness et al. | 350/96.12 |
| 4,441,186 | 4/1984 | Erickson | 372/98 X |
| 4,533,207 | 8/1985 | Alferness | 350/96.14 |
| 4,553,810 | 11/1985 | Alferness et al. | 350/96.14 |
| 4,667,331 | 5/1987 | Alferness et al. | 372/12 |

OTHER PUBLICATIONS

Optical Letters, vol. 2(2), Feb. 1978, "Efficient Optical Waveguide . . . " by R. V. Schmidt et al., pp. 45–47.

*Primary Examiner*—John Lee
*Attorney, Agent, or Firm*—Gregory C. Ranieri

[57] ABSTRACT

Optical functions such as Q-switching, mode locking, cavity dumping, and modulation are generated by a simple laser arrangement which includes a gain medium and an electrically controllable, optical waveguide device optically coupled to the gain medium. The gain medium and waveguide device are either interposed between two reflective surfaces or coupled by a waveguide in order to form a single composite cavity laser structure.

6 Claims, 3 Drawing Figures

COMPOSITE CAVITY LASER UTILIZING AN INTRA-CAVITY ELECTROOPTIC WAVEGUIDE DEVICE

This is a division of application Ser. No. 572,634, filed Jan. 20, 1984, now U.S. Pat. No. 4,667,331.

BACKGROUND OF THE INVENTION

This invention relates to the field of optical sources and, in particular, to composite cavity lasers.

Lasers have been utilized in such applications as communications, manufacturing, and testing. Each application requires somewhat different operating characteristics or functions from the laser. In one application, it may be necessary to generate very narrow, high power pulses while, in another application, it is necessary to generate frequency-shift-keyed pulses. In yet another application, it may be necessary to tune the laser to any wavelength in the gain envelope.

While various techniques are known for providing the desired characteristics, each technique requires that the laser be incorporated into a new configuration of elements. For example, mode locking laser arrangements which produce narrow pulses are quite different from modulation arrangements which produce frequency-shift-keyed or chirped pulses. Because of these differences, it has not been possible to provide the desired characteristics or functions from a single laser arrangement.

SUMMARY OF THE INVENTION

Various optical functions are generated in accordance with the present invention by a simple laser arrangement which includes a gain medium and an electrically controllable, optical waveguide device optically coupled to the gain medium. The gain medium and waveguide device are either interposed between two reflective surfaces or coupled by a waveguide in order to form a composite cavity laser structure, that is, the laser is comprised of only a single cavity.

BRIEF DESCRIPTION OF THE DRAWING

A more complete understanding of the invention may be obtained by reading the following description of specific illustrative embodiments of the invention in conjunction with the appended drawing in which.

DETAILED DESCRIPTION

Figure 1:
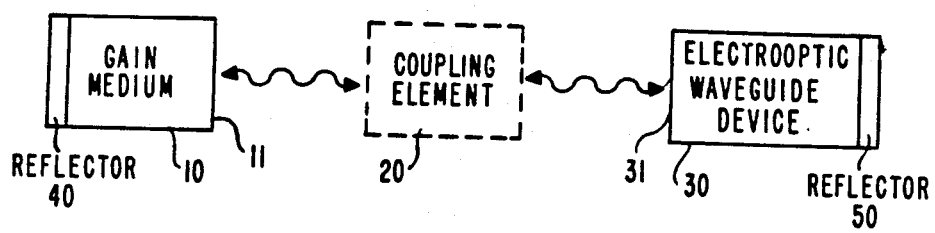
FIGS. 1 and 2 are schematic illustrations of composite cavity lasers in accordance with the present invention.

FIG. 1 shows an illustrative embodiment of the invention which includes gain medium 10, coupling element 20 and electrooptic waveguide device 30 interposed between reflectors 40 and 50. Surface 11 of gain medium 10 and surface 31 on electrooptic waveguide device 30 are coated with antireflective material to eliminate unwanted reflections and facilitate coupling of gain medium 10 to device 30. As such, the embodiment shown in FIG. 1 is a single composite cavity optoelectronic device wherein device 30 is an intracavity element.

Gain medium 10 includes an active gain medium such as a semiconductor heterostructure having mirror facets perpendicular to the propagation direction. Another suitable gain medium is a length of optical fiber injected with a gas such as molecular hydrogen, oxygen or nitrogen. The latter type of gain medium is described in J. Stone et al., *Optics Letters,* Vol. 7, p. 297 (1982). Gain medium 10 also includes an electrical or optical pump coupled to the active gain medium to cause a known condition necessary for stimulated emission of light therefrom.

Surface 11 of gain medium 10 is coated with antireflective material to promote efficient optical coupling within the cavity while minimizing unwanted reflections. From experimental practice, the modal reflectivity on surface 11 is generally less than $10^{-3}$. Qualitatively, this means that gain medium 10 can not be pumped to lase in an extra-cavity environment.

Coupling element 20 is between gain medium 10 and electrooptic waveguide device 30. It is shown in dashed outline because it is an optional element. From experimental practice, it is known that lensed optical fibers or lens arrangements are well adapted for coupling light to and from each of gain medium 10 and electrooptic waveguide device 30. However, it is also possible to butt-couple gain medium 10 to electrooptic waveguide device 30 or merely leave an air gap therebetween.

Electrooptic waveguide device 30 is optically coupled to gain medium 10 via surface 31. Antireflection coating may be applied to surface 31 to enhance coupling efficiency. Electrooptic waveguide device 30 includes one or more optical waveguides which are electrically controllable to produce a desired effect such as high speed switching, tunable wavelength filtering and polarization conversion, for example. Each effect is employed to generate a particular function for the composite cavity laser. For a survey of different electrooptic waveguide devices, see R. Alferness, *Journal of Quantum Electronics,* Vol. QE-17, No. 6, pp. 946-976 (1981).

In an example from experimental practice, electrooptic waveguide device 30 includes one or more titanium diffused waveguides in Z-cut, Y-propagating lithium niobate. While other materials may be employed for waveguide device 30, the exemplary materials are known to give good results.

Reflectors 40 and 50 are reflective surfaces which delineate and complete the laser cavity. Reflector 40 is shown adjacent to a surface of gain medium 10; reflector 40 can be realized as an integral mirror such as a cleaved facet, for example, or as a reflective mirror coating or as a spaced apart reflective surface such as a spherical or parabolic mirror, for example. Reflector 50 is shown adjacent to electrooptic waveguide device 30. This reflector is usually formed by coating an end of one waveguide on the edge of device 30 through which optical energy exits the device. Other reflective surfaces such as the spaced apart reflectors described above are suitable as reflector 50. When the output is taken from electrooptic waveguide device 30, the reflectance of reflector 40 is chosen to provide much higher reflection than transmission. On the other hand, reflector 50 may exhibit a reflectance which allows either high reflection or high transmission in accordance with the function to be performed by the composite cavity laser. Reflectors 40 and 50 may be comprised of metallic materials such as gold, multilayer metallic materials such as chromium and gold, or thin multilayer dielectric materials.

Figure 2:
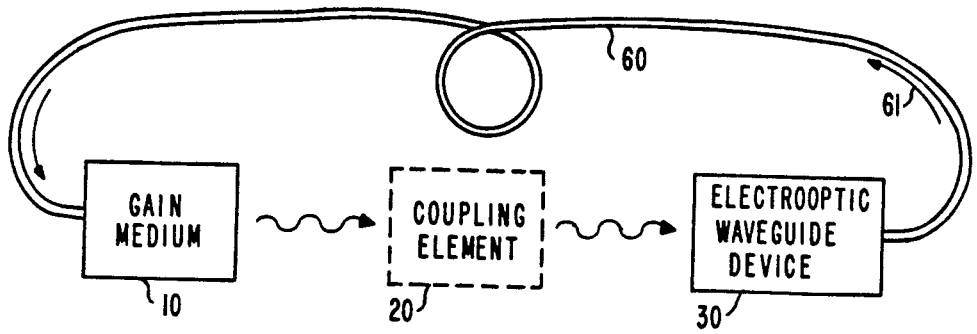

FIG. 2 is an alternate embodiment of the composite cavity laser shown in FIG. 1. Reflectors 40 and 50 from FIG. 1 are replaced by an optical waveguide 60 as shown in FIG. 2. The laser in FIG. 2 exhibits a ring or folded cavity structure. This structure is particularly useful for restricting the optical energy building up in the cavity to have substantially unidirectional propagation as noted by arrow 61. As a result, the optical energy passes through electrooptic waveguide device 30 in a single direction.

Optical waveguide 60 is realized most advantageously as an optical fiber coupled to gain medium 10 and electrooptic waveguide device 30.

Figure 3:
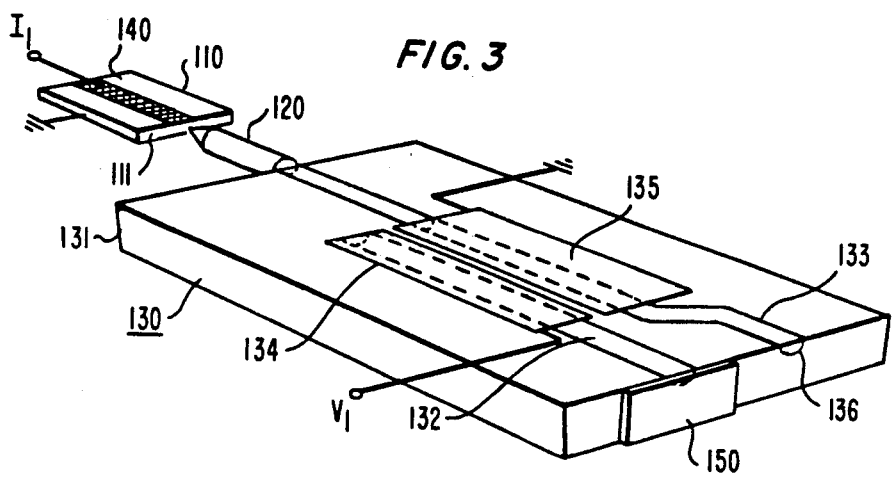
FIG. 3 is an illustration of a specific embodiment of the laser shown in FIG. 1.

With respect to FIGS. 1 and 2, electrooptic waveguide device 30 is controlled to vary the loss of the laser cavity effectively from 0 percent to 100 percent. By varying the loss of the cavity, electrooptic waveguide device 30 in combination with gain medium 10 and reflectors 40, 50 or waveguide 60 can provide such useful functions as Q-switching, mode locking, cavity dumping, modulation and wavelength selective tuning or the like. An arrangement for mode locking is shown in FIG. 3. Arrangements for generating other functions are described below in reference to a particular type of electrooptic wave guide device. In providing these functions, the present composite cavity laser has an important advantage over other lasers. First, electrooptic waveguide device 30 is a broadband device and, therefore, device 30 controls the speed of operation. This is in contrast to other lasers whose speeds are limited by the active gain medium.

FIG. 3 shows a specific embodiment of the composite cavity laser shown in FIG. 1. The laser includes a stripe geometry, double heterostructure, semiconductor laser diode 110 having antireflective coated facet 111 and reflective mirror facet 140. Pumping current $I_1$ is delivered to diode 110. Coupling element 120 is a lensed single mode fiber directly attached to surface 131 on electrooptic waveguide device 130. Electrooptic waveguide device 130 is a waveguide directional coupler switch. Device 130 includes cross over waveguide 132 and straight-through waveguide 133. Electrodes 134 and 135 over waveguides 132 and 133, respectively, receive a supplied signal $V_1$ which controls configuration of the switch. Reflector 150 is metallic (e.g., gold) and is deposited on the end of cross-over waveguide 132. Optical energy is output from the laser via output 136. Output 136 can be coupled to an optical fiber, for example.

Mode locking for the laser shown in FIG. 3 is achieved by biasing device 130 via signal $V_1$ for approximately 50 percent coupling from waveguide 133 into waveguide 132. Signal $V_1$ also includes an RF component which drives device 130 at a fundamental or harmonic of the round trip frequency for the cavity. This frequency is determined as (C/2L) where L is the optical length of the cavity. Diode 110 is dc biased above threshold. In an example from experimental practice, this laser was mode locked to produce a train of narrow pulses (~22 psec at full width half maximum) at 7.2 GHz (fourth harmonic) and 1.8 GHz (fundamental) repetition rates.

For the laser shown in FIG. 3, it should be obvious to those skilled in the art that reflector 150 could be placed over the end of waveguide 133 so that cross over waveguide 132 could generate the output signal. Of course, this modification may necessitate a change in signal $V_1$.

Additionally, the laser shown in FIG. 3 is also capable of providing the function of cavity dumping. This is accomplished by operating device 130 in the cross over mode so that all optical energy is trapped in the cavity between reflectors 140 and 150. At prescribed time intervals via signal $V_1$, device 130 is changed to the straight-through mode so that the optical energy is dumped out on waveguide 133 at output 136. Of course, cavity dumping can be optimized by coating surface 140 to exhibit high reflectance, for example.

As described above, the composite cavity laser shown in FIG. 3 is a special case of the laser shown in FIG. 1. The laser in FIG. 3, which provides a mode locking function and a cavity dumping function, resulted from a substitution of a waveguide directional coupler for the electrooptic waveguide device in FIG. 1. This and other substitutions can be performed on the lasers in FIGS. 1 and 2 to change the function of the lasers. These substitutions are described below with respect to each group of electrooptic waveguide device and to the expected functions performed by the composite cavity laser including such a device.

One group of electrooptic waveguide devices is that of amplitude modulators. Amplitude modulators are shown in an article from *Optics Letters*, Vol. 2, No. 2, pp. 45–47 (1978) and in U.S. Pat. Nos. 3,877,781; 4,005,927; 4,012,113; 4,111,523; 4,157,860; 4,243,295; 4,251,130; 4,372,643; 4,380,364; and 4,381,139. These electrooptic waveguide devices can be substituted for device 30 in FIGS. 1 and 2 to produce such functions as mode locking, Q-switching or power control for the composite cavity laser.

Another group of devices is that of the 2×2 switch. Within that group is a set of devices characterized by electrodes which are velocity matched. Switches are shown in the article from *Optics Letters*, Vol. 2, No. 2, pp. 45–47 (1978), in U.S. Pat. Nos. 4,005,927; 4,012,113; 4,146,297; 4,157,860; 4,243,295; 4,251,130; 4,273,411; 4,372,643; 4,380,364; and 4,381,139 and in a copending application for U.S. patent, Ser. No. 487,249, filed by R. Alferness et al on Apr. 21; 1983 (now U.S. Pat. No. 4,553,810). The Alferness et al. application describes the advantages of using a velocity matched electrode structure. These switches are useful for mode locking and combined mode locking and cavity dumping. Also, the switches can be used for making a Q-switched ring laser. For switches, reflector 50 is placed over the end of either the straight through waveguide or the cross over waveguide.

Tunable filters form yet another group of devices. These include directional coupler filters and mode converter, wavelength dependent filters. These devices are useful for making the composite cavity laser continuously tunable over a broadband of wavelengths. They are also employed for mode locking with wavelength control. Filters are described in U.S. Pat. Nos. 4,039,249; 4,146,297; 4,273,411; and 4,390,236 and in a copending application for U.S. patent, Ser. No. 506,456, filed by R. C. Alferness on June 21, 1983 (now U.S. Pat. No. 4,553,207).

Another group of devices is formed by polarization controllers. These devices are useful in ring lasers which utilize a polarization non-maintaining fiber as waveguide 60. Polarization controllers are described in U.S. Pat. No. 4,384,760, for example.

A final group of devices is known as phase shifters. These devices are used for shifting the composite cavity laser Fabry-Perot modes. Phase shifters are shown in the article and many of the other references cited above.

The list of references cited above is not all inclusive and has been given for purposes of illustration and incorporation not for purposes of limitation. Also, the functions given are meant to be exemplary but not limiting.

While it has been shown throughout this specification that the electrooptic waveguide device is electrically controllable, it should be clear to those skilled in the art that the gain medium is either optically or electrically controllable. In one example, this can be used advantageously to perform double mode locking by controlling both the gain medium and the electrooptic waveguide device.

What is claimed is:

1. An optoelectronic device for generating optical signals including an electrooptic waveguide means being electrically controllable for varying a predetermined characteristic therein and including at least one optical waveguide, a gain medium being optically coupled to a first end surface of the at least one optical waveguide, means being optically coupled to both the gain medium and a second end surface opposite said first end surface of the at least one optical waveguide for transferring optical signals between the electrooptic waveguide means and the gain medium such that a single resonant optical cavity is formed in the optoelectronic device.

2. The device as defined in claim 1 further including means for coupling the gain medium to the first end surface of the at least one optical waveguide.

3. The device as defined in claim 1 wherein the electrooptic waveguide means is a directional coupler switch.

4. The device as defined in claim 1 wherein the electrooptic waveguide means is a tunable filter.

5. The device as defined in claim 1 wherein the electrooptic waveguide means is a polarization controller.

6. The device as defined in claim 1 further including means for extracting optical signals from the electrooptic waveguide means.

* * * * *